United States Patent
Kaneko et al.

(10) Patent No.: US 10,665,465 B2
(45) Date of Patent: May 26, 2020

(54) SURFACE TREATMENT METHOD FOR SIC SUBSTRATE

(71) Applicants: KWANSEI GAKUIN EDUCATIONAL FOUNDATION, Nishinomiya-shi, Hyogo (JP); TOYO TANSO CO., LTD., Osaka-shi, Osaka (JP)

(72) Inventors: Tadaaki Kaneko, Sanda (JP); Koji Ashida, Sanda (JP); Yasunori Kutsuma, Sanda (JP); Satoshi Torimi, Kanonji (JP); Masato Shinohara, Kanonji (JP); Youji Teramoto, Kanonji (JP); Norihito Yabuki, Kanonji (JP); Satoru Nogami, Kanonji (JP)

(73) Assignees: KWANSEI GAKUIN EDUCATIONAL FOUNDATION, Nishinomiya-shi (JP); TOYO TANSO CO., LTD., Osaka-shi (JP)

( * ) Notice: Subject to any disclaimer, the term of this patent is extended or adjusted under 35 U.S.C. 154(b) by 191 days.

(21) Appl. No.: 15/527,526

(22) PCT Filed: Nov. 17, 2015

(86) PCT No.: PCT/JP2015/005743
§ 371 (c)(1),
(2) Date: May 17, 2017

(87) PCT Pub. No.: WO2016/079984
PCT Pub. Date: May 26, 2016

(65) Prior Publication Data
US 2017/0345672 A1    Nov. 30, 2017

(30) Foreign Application Priority Data

Nov. 18, 2014  (JP) ................. 2014-233632

(51) Int. Cl.
*H01L 21/306* (2006.01)
*C30B 29/36* (2006.01)
(Continued)

(52) U.S. Cl.
CPC ........ *H01L 21/30621* (2013.01); *C30B 29/36* (2013.01); *C30B 33/12* (2013.01);
(Continued)

(58) Field of Classification Search
CPC ............. H01L 21/02664; H01L 21/304; H01L 21/302; H01L 21/02529; H01L 21/02378
See application file for complete search history.

(56) References Cited

U.S. PATENT DOCUMENTS

| 2013/0020611 A1* | 1/2013 | Gumaelius | .......... | H01L 21/3065 |
| | | | | 257/183 |
| 2013/0029158 A1* | 1/2013 | Aigo | ....................... | C30B 25/10 |
| | | | | 428/446 |

(Continued)

FOREIGN PATENT DOCUMENTS

| CN | 102534808 A | 7/2012 |
| CN | 103247679 A | 8/2013 |

(Continued)

OTHER PUBLICATIONS

International Search Report dated Feb. 23, 2016, issued in counterpart International Application No. PCT/JP2015/005743 (2 pages).

(Continued)

*Primary Examiner* — Nilufa Rahim
(74) *Attorney, Agent, or Firm* — Westerman, Hattori, Daniels & Adrian, LLP

(57) ABSTRACT

Provided is a surface treatment method for a SiC substrate (40), the method being capable of controlling whether to generate a step bunching or the type of step bunching that is generated. In the surface treatment method in which the (Continued)

surface of the SiC substrate (40) is etched by heating the SiC substrate (40) under Si vapor pressure, an etching mode and an etching depth which are determined at least on the basis of an etching rate, are controlled to etch the SiC substrate (40), so that a surface pattern of the SiC substrate (40) after etching treatment is controlled.

16 Claims, 12 Drawing Sheets

(51) Int. Cl.
*C30B 33/12* (2006.01)
*H01L 21/302* (2006.01)
*H01L 21/04* (2006.01)
*H01L 21/304* (2006.01)

(52) U.S. Cl.
CPC ........ *H01L 21/0445* (2013.01); *H01L 21/302* (2013.01); *H01L 21/304* (2013.01)

(56) References Cited

U.S. PATENT DOCUMENTS

| 2013/0207080 A1 | 8/2013 | Dimitrakopoulos et al. |
| 2015/0225873 A1 | 8/2015 | Fujiwara et al. |
| 2015/0294867 A1 | 10/2015 | Torimi et al. |
| 2016/0111279 A1 | 4/2016 | Kaneko et al. |

FOREIGN PATENT DOCUMENTS

| JP | 2003-234313 A | 8/2003 |
| JP | 2008-16691 A | 1/2008 |
| JP | 2008-230944 A | 10/2008 |
| JP | 2010-265126 A | 11/2010 |
| JP | 2012-209415 A | 10/2012 |
| JP | 2014-24704 A | 2/2014 |
| WO | 2014/076963 A1 | 5/2014 |
| WO | 2014/199614 A1 | 12/2014 |

OTHER PUBLICATIONS

Extended European Search Report dated May 3, 2018, issued in counterpart European Application No. 15861692.0. (5 pages).

* cited by examiner

Fig.3

| TREATMENT CONDITIONS | BEFORE TREATMENT | AFTER VAPOR ETCHING | AFTER EPITAXIAL GROWTH | AFTER KOH ETCHING |
|---|---|---|---|---|
| CHEMICAL MECHANICAL POLISHING SUBSTRATE | 400μm → ↓ | | LATENT SCRATCHES APPEARED | LATENT SCRATCHES KEEPING |
| MECHANICAL POLISHING + Si VAPOR ETCHING 5μm SUBSTRATE | MECHANICAL POLISHING SURFACE | | LATENT SCRATCHES APPEARED | CRYSTAL DEFECT OCCURRENCE (TRIANGLE) |
| MECHANICAL POLISHING + Si VAPOR ETCHING 13μm SUBSTRATE | DATA AT SAME PLACE N/A | | LATENT SCRATCHES APPEARED | CRYSTAL DEFECT OCCURRENCE (TRIANGLE) |
| MECHANICAL POLISHING + Si VAPOR ETCHING 25μm SUBSTRATE | | | NO CHANGE | NO CHANGE |

Fig.4

| SURFACE TREATMENT CONDITIONS | AFTER 1st EPI | AFTER 2nd EPI | AFTER 3rd EPI | AFTER 4th EPI |
|---|---|---|---|---|
| CHEMICAL MECHANICAL POLISHING SUBSTRATE | LATENT SCRATCHES APPEARED ↗ ↙ 400μm | LATENT SCRATCHES KEEPING | SURFACE ROUGHENING (BUNCHING) | SURFACE ROUGHENING (BUNCHING) |
| MECHANICAL POLISHING + Si VAPOR ETCHING 5μm SUBSTRATE | NO CHANGE | NO CHANGE | SURFACE ROUGHENING (BUNCHING) | SURFACE ROUGHENING (BUNCHING) |
| MECHANICAL POLISHING + Si VAPOR ETCHING 13μm SUBSTRATE | NO CHANGE | NO CHANGE | NO CHANGE | SURFACE ROUGHENING (BUNCHING) |
| MECHANICAL POLISHING + Si VAPOR ETCHING 25μm SUBSTRATE | NO CHANGE | NO CHANGE | NO CHANGE | NO CHANGE |

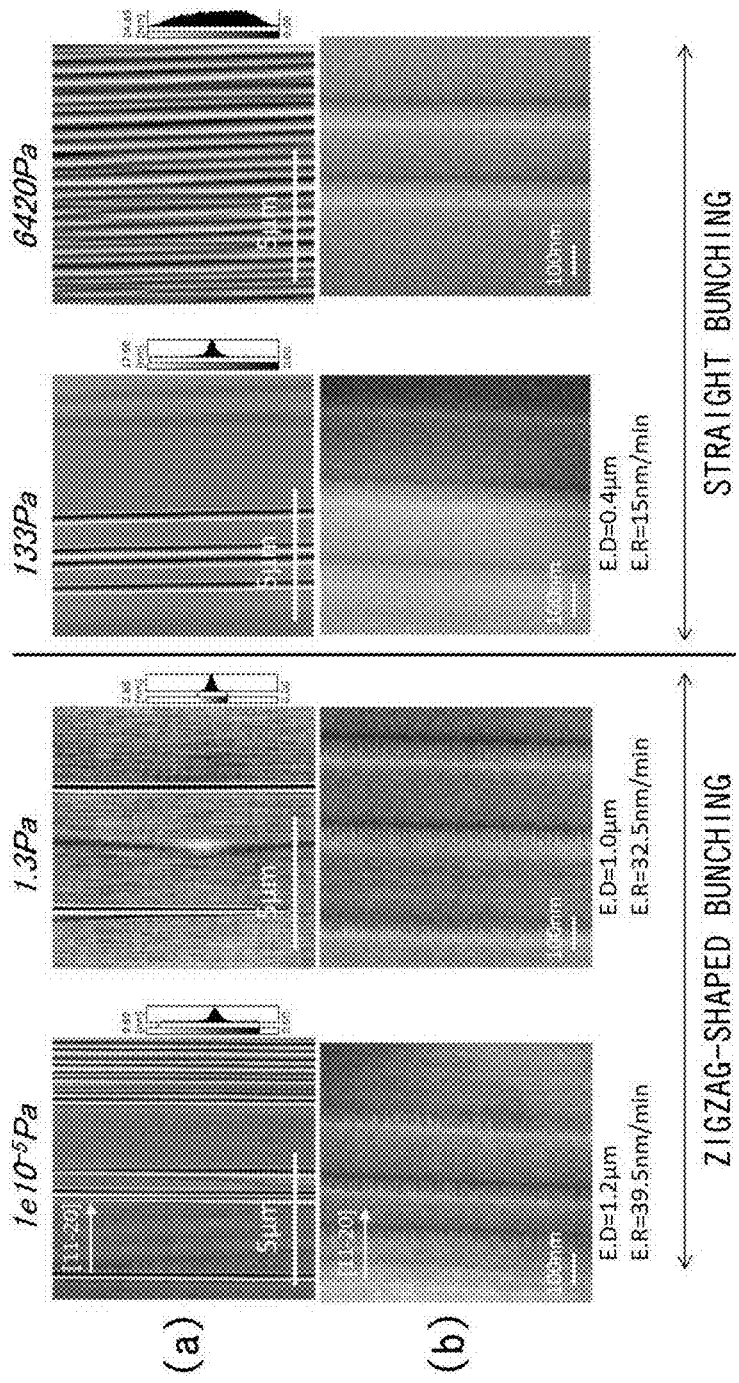

SURFACE TREATMENT METHOD FOR SIC SUBSTRATE

TECHNICAL FIELD

The present invention relates mainly to a surface treatment method in which a SiC substrate is etched by heating the SiC substrate under Si vapor pressure.

BACKGROUND ART

SiC, which is superior to Si or the like in, for example, heat resistance and electrical characteristics, has attracted attention as a new semiconductor material.

Patent Document 1 discloses a surface treatment method for planarizing a surface of such SiC substrate. In the surface treatment method, the SiC substrate is heated while stored in a storing container having Si vapor pressure in its inside. Accordingly, the SiC substrate arranged within the storing container is etched, which can obtain a SiC substrate that is planar at a molecular level.

Here, the SiC substrate can be obtained by cutting out of an ingot made of single crystal SiC at a predetermined angle. When a semiconductor element is manufactured from the SiC substrate that is cut out, an epitaxial growth is performed. However, since a surface roughness is large in a state of the SiC substrate that is cut out, it is required to planarize the surface by performing steps of treatment such as mechanical polishing (MP) and chemical mechanical polishing (CMP), etc. However, polishing scratches are generated on the surface of the SiC substrate by performing mechanical polishing and chemical mechanical polishing, etc. A modified layer having disordered crystallinity that is formed by applying the pressure on the surface of the SiC substrate during mechanical polishing and chemical mechanical polishing (hereinafter, referred to as latent scratches) is generated.

PRIOR-ART DOCUMENTS

Patent Documents

PATENT DOCUMENT 1: Japanese Patent Application Laid-Open No. 2008-16691

SUMMARY OF THE INVENTION

Problems to be Solved by the Invention

When an epitaxial growth is subjected to the SiC substrate having latent scratches, such latent scratches results in a plurality of scratches on the surface of the SiC substrate. When the SiC substrate having an off angle is heated, a step bunching is generated on the surface of the SiC substrate. The step bunching is a step in which a plurality of SiC layers forms a bunch (for example, a step having the height of 1 nm or more).

The semiconductor element is created from the SiC substrate in which the step bunching is generated, which may make the device structure of a semiconductor device unstable, or may cause a local concentration of an electric field to degrade the performance of the semiconductor device. When latent scratches remain on the surface of the SiC substrate, during the epitaxial growth, a stacking fault is generated in an epitaxial layer, with the latent scratches as a starting point. This leads to degradation of crystal quality. It has been known that the stacking fault results in degradation of the semiconductor element that is created, especially characteristics of a power device. Therefore, removal of latent scratches is necessary for quality improvement and cost reduction of a SiC semiconductor element. On the other hand, recently, when a liquid-phase growth or the like is performed by using a step of the step bunching, it has been known that the effect of crystal dislocation may be reduced as compared with a normal state. In addition, it has been known that the step bunching has a various type (for example, see FIG. 5 that will be described later), and each of types may have various characteristics.

The present invention has been made in view of the circumstances described above, a primary object is to provide a surface treatment method for obtaining a SiC substrate in which latent scratches existing on the surface of the SiC substrate are removed and the surface is planarized. An additional object is to provide the SiC substrate surface treatment method capable of controlling whether to generate a step bunching or the type of step bunching that is generated.

Means for Solving the Problems and Effects Thereof

Problems to be solved by the present invention are as described above, and next, means for solving the problems and effects thereof will be described.

In a first aspect of the present invention, in a surface treatment method for heating a SiC substrate under Si vapor pressure and thereby etching the surface of the SiC substrate, the following surface treatment method is provided. That is, in the surface treatment method, the SiC substrate is etched while controlling an etching mode that is determined based on at least a rate of etching, and a depth of etching, so that a surface pattern of the SiC substrate after etching is controlled.

Accordingly, the rate of etching is changed, which can select whether to generate the step bunching or the type of step bunching, for example. Furthermore, the depth of etching is controlled, which can obtain the SiC substrate having a smooth terrace in which latent scratches are removed in a treatment of the SiC substrate for an epitaxial growth, for example.

In another aspect of the present invention, preferably, the surface treatment method for heating the SiC substrate under Si vapor pressure and thereby etching the surface of the SiC substrate is as follows. That is, the etching of the SiC substrate is performed with a control of the etching mode that is determined based on at least the rate of etching, and thereby the surface pattern of the SiC substrate after etching is controlled. The etching mode includes an anisotropic etching mode in which the rate of etching is lower than a reference rate of etching and an isotropic etching mode in which the rate of etching is higher than the reference rate of etching. When the etching is performed in the anisotropic etching mode, the step bunching remains. When the etching is performed in the isotropic etching mode, the step bunching is decomposed.

Accordingly, the rate of etching is changed, which can select whether to generate the step bunching or the type of step bunching that is generated, for example. Furthermore, the etching is performed so as not to generate the step bunching, or so as to generate the step bunching.

In the surface treatment method of the SiC substrate, the reference rate of etching is preferably determined based on the temperature at a time of etching.

Accordingly, since the rate of Si elimination from the SiC substrate is changed in accordance with the temperature for etching, the reference rate of etching is determined in consideration of such change, which can accurately control whether to generate the step bunching.

In the surface treatment method of the SiC substrate, the reference rate of etching is preferably determined based on an off angle of the SiC substrate.

In the surface treatment method of the SiC substrate, the SiC substrate preferably has the off angle of 0.71° or more and 4° or less.

Accordingly, it is found that a SiC molecular layer step end density that is exposed to a SiC outermost surface is changed depending on the off angle of the SiC substrate, and the tendency of occurrence of step bunching is varied. Therefore, the reference rate of etching is determined in consideration of such result, which can accurately control whether to generate the step bunching.

In the surface treatment method of the SiC substrate, the off angle is preferably oriented in a [11-20] direction.

In the surface treatment method of the SiC substrate, the etching mode is preferably determined based on the rate of etching that is determined by the pressure of inert gas in an atmosphere for heating the SiC substrate.

Accordingly, as the pressure of inert gas is higher, Si thermal decomposition from the SiC substrate is suppressed. Therefore, the reference rate of etching is determined in consideration of such result, which can accurately control whether to generate the step bunching.

In the surface treatment method of the SiC substrate, when the etching is performed in the anisotropic etching mode, it is preferable to etch the SiC substrate while controlling at least any one of the rate of etching, the temperature during the etching, the off angle of the SiC substrate, and the pressure of inert gas, and thereby control that a terrace end after etching has either a straight shape or a zigzag shape.

Accordingly, either one of two types of step bunching having different characteristics can be selected and then generated.

In the surface treatment method of the SiC substrate, the surface of the SiC substrate is preferably 4H-SiC (0001) Si-face.

In the surface treatment method of the SiC substrate, the rate of etching is preferably adjusted based on at least any one of the temperature during the etching, the pressure of inert gas, and a composition of tantalum silicide provided within a storing container that stores the SiC substrate.

Accordingly, since the rate of etching can be changed in various methods, the rate of etching can be adjusted even when the temperature during the etching is not preferably changed.

In the surface treatment method of the SiC substrate, the depth of etching is preferably determined based on the treatment performed to the SiC substrate before etching.

Accordingly, since the depth of latent scratches existing on the SiC substrate is varied depending on the treatment, the depth of etching is determined in consideration of treatment, which can accurately control the surface pattern of the SiC substrate.

In the surface treatment method of the SiC substrate, the treatment is preferably mechanical polishing or chemical mechanical polishing.

Accordingly, latent scratches that are generated by the general treatment after cutting out of the ingot can be removed.

BRIEF DESCRIPTION OF THE DRAWINGS

FIG. 3 Photomicrographs showing a surface appearance after an epitaxial growth is performed to SiC substrates having different depth of etching.

FIG. 4 Photomicrographs showing a surface appearance after a heat treatment is performed to SiC substrates having different depth of etching.

FIG. 15 AFM images and SEM images specifically showing the zigzag-shaped bunching and the straight bunching that are appeared when the pressure of argon is changed.

EMBODIMENT FOR CARRYING OUT THE INVENTION

Next, an embodiment of the present invention will be described with reference to the drawings. Firstly, referring to FIG. 1, a high temperature vacuum furnace 10 used for a heat treatment of this embodiment will be described.

Figure 1:
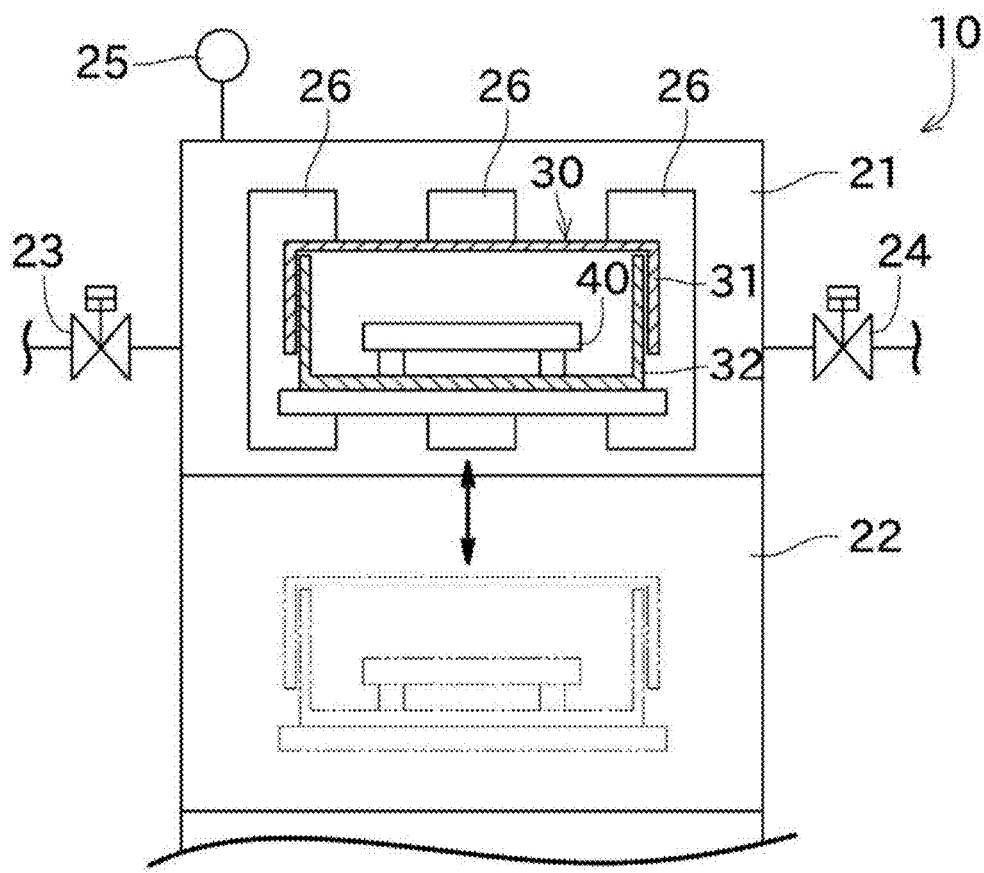
FIG. 1 A diagram for illustration of an outline of a high temperature vacuum furnace for use in a heat treatment according to the present invention.

As shown in FIG. 1, the high temperature vacuum furnace 10 includes a main heating chamber 21 and a preheating chamber 22. The main heating chamber 21 is configured to heat a SiC substrate 40 (single crystal SiC substrate) made of, at least in its surface, single crystal SiC, up to a temperature of 1000° C. or more and 2300° C. or less. The preheating chamber 22 is a space for preheating a SiC substrate prior to heating of the SiC substrate 40 in the main heating chamber 21.

A vacuum-forming valve 23, an inert gas injection valve 24, and a vacuum gauge 25 are connected to the main heating chamber 21. The vacuum-forming valve 23 is configured to adjust the degree of vacuum of the main heating chamber 21. The inert gas injection valve 24 is configured to adjust the pressure of an inert gas (for example, Ar gas) contained in the main heating chamber 21. The vacuum gauge 25 is configured to measure the degree of vacuum of the interior of the main heating chamber 21.

Heaters 26 are provided in the main heating chamber 21. A heat reflection metal plate (not shown) is secured to a side wall and a ceiling of the main heating chamber 21. The heat reflection metal plate is configured to reflect heat of the heaters 26 toward a central region of the main heating chamber 21. This provides strong and uniform heating of the SiC substrate 40, to cause a temperature rise up to 1000° C. or more and 2300° C. or less. Examples of the heaters 26 include resistive heaters and high-frequency induction heaters.

The SiC substrate 40 is heated while stored in a crucible (storing container) 30. The crucible 30 is placed on an appropriate support or the like, and the support is movable at least in a range from the preheating chamber to the main heating chamber. The crucible 30 includes an upper container 31 and a lower container 32 that are fittable with each other. Detailed configuration of the crucible 30 will be described later.

To perform a heat treatment of the SiC substrate 40, the crucible 30 is firstly placed in the preheating chamber 22 of the high temperature vacuum furnace 10 as indicated by the dot-dash lines in FIG. 1, and preheated at an appropriate temperature (for example, about 800° C.). Then, the crucible 30 is moved to the main heating chamber 21 whose temperature has been elevated to a set temperature (for example, about 1800° C.) in advance. After that, the SiC substrate 40 is heated while adjusting the pressure and the like. The preheating may be omitted.

Next, a composition of a wall surface of the crucible 30 will be described with reference to FIG. 2.

Figure 2:
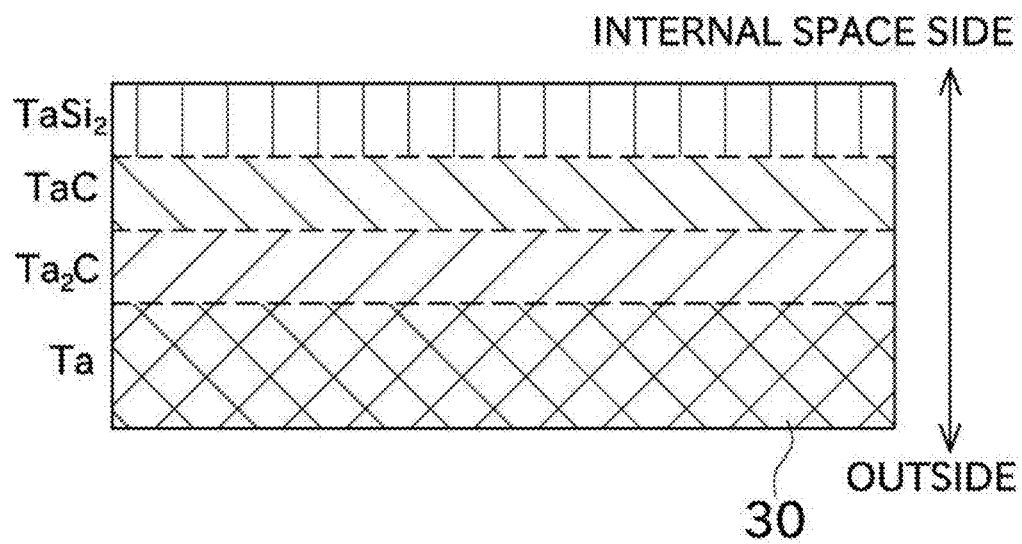
FIG. 2 A schematic view showing a composition of a wall surface of a crucible.

The crucible 30 has a configuration shown in FIG. 2, in its portion constituting wall surfaces that define an internal space for storing the SiC substrate 40. More specifically, a tantalum layer (Ta), a tantalum carbide layer (TaC and $Ta_2C$), and a tantalum silicide layer ($TaSi_2$) are provided in this order from the outside toward the internal space side.

The crucible made of the tantalum layer and the tantalum carbide layer has been conventionally known. In this embodiment, the tantalum silicide layer is additionally formed in the crucible. The tantalum silicide layer is for supplying Si to the internal space and causing Si vapor pressure in the internal space. Instead of a composition in which the tantalum silicide layer is provided on the inner wall surface of the crucible 30, solid Si may be arranged within the crucible 30.

A method for forming the tantalum silicide layer will be briefly described below. The tantalum silicide layer is formed by bringing molten Si into contact with the inner wall surface of the crucible and heating it at a predetermined temperature. Thereby, the tantalum silicide layer, for example, made of $TaSi_2$ is formed. In this embodiment, the tantalum silicide layer having a thickness of about 30 µm to 50 µm is formed. Depending on the volume of the internal space, etc., the tantalum silicide layer having a thickness of, for example, 1 µm to 300 µm may be formed.

The tantalum silicide layer can be formed through the above-described process. Although this embodiment adopts $TaSi_2$ as tantalum silicide, tantalum silicide represented by other chemical formula (for example, $Ta_5Si_3$) may be also adoptable. A plurality of types of tantalum silicide laminated one on another is also acceptable. In this embodiment, the tantalum silicide layer is provided over an entire wall surface that defines the internal space. This allows Si pressure in the internal space to be uniform.

The crucible 30 has a function for absorbing carbon atoms continuously from the internal space. Accordingly, since only C vapor out of Si vapor and C vapor that are contained in an atmosphere within the crucible 30 during heat treatment is selectively occluded in the crucible 30, the internal space of the crucible 30 can be maintained in a further high-purity Si atmosphere.

Next, latent scratches that exists on the SiC substrate 40 and an etching for removing the latent scratches will be described with reference to FIG. 3 to FIG. 6.

A bulk substrate as a source for manufacturing a semiconductor element can be obtained by cutting out of the ingot made of 4H-SiC single crystal or 6H-SiC single crystal to a predetermined thickness. The bulk substrate having an off angle (for example, the off angle that is oriented in a [11-20] direction) by diagonally cutting out of the ingot. After that, mechanical polishing and chemical mechanical polishing, etc. are performed for removing a surface roughness of the bulk substrate. Although polishing scratches that remain on the surface of the SiC substrate 40 can be substantially removed by mechanical polishing and chemical mechanical polishing, etc., a part of deep polishing scratches or a modified layer having disordered crystallinity that is formed by applying the pressure on the surface of the SiC substrate 40 during mechanical polishing and chemical mechanical polishing (hereinafter, referred to as latent scratches) may remain. Therefore, latent scratches that are caused by treatment such as mechanical polishing and chemical mechanical polishing exist in the SiC substrate 40 that is commercially available.

In the following, an experiment that is performed for confirming an effect of the latent scratches will be described with reference to FIG. 3 and FIG. 4. In the experiment, only chemical mechanical polishing was performed to one of four commercially available SiC substrates 40 without Si vapor pressure etching. Three of four SiC substrates 40 which were respectively subjected to, after mechanical polishing, Si vapor pressure etching with a depth of 5 µm, Si vapor pressure etching with a depth of 13 µm, and Si vapor pressure etching with a depth of 25 µm, were prepared. Then, an epitaxial growth was performed to four SiC substrates 40 by a conventional chemical vapor deposition method with a depth of about 10 µm, and then each of the surfaces ((0001) Si-face) of four SiC substrates 40 was observed. In the following description, Si vapor pressure etching will be merely referred to as an etching. After etching, each of four SiC substrates 40 was subjected to heat treatment at a predetermined temperature and period, and each of the surfaces ((0001) Si-face) of four SiC substrates 40 was observed.

FIG. 3 is photomicrographs showing a surface appearance of the SiC substrates 40 after the above-described etching and the epitaxial growth. As shown in FIG. 3, before and after the etching, even when the surface roughening is not generated, it is found that the surface roughening (crystal defect) is generated by performing hydrogen etching and forming an epitaxial growth layer. The depth of etching of the SiC substrate 40 is larger than 13 µm, and thereby latent scratches can be almost completely removed.

FIG. 4 is photomicrographs showing a surface appearance of the SiC substrates 40 after further heat treatment. As shown in FIG. 4, when the etching is not performed, it is found that the surface roughening (step bunching) is generated by heat treatment. It is also found that the surface is further likely to be roughened as the heating temperature is higher. The surface roughening can be suppressed by etching the SiC substrate 40. However, in consideration that a slight surface roughening is generated in the SiC substrate having the depth of etching of 13 μm, latent scratches can be almost completely removed by increasing the depth of etching.

Figure 5:
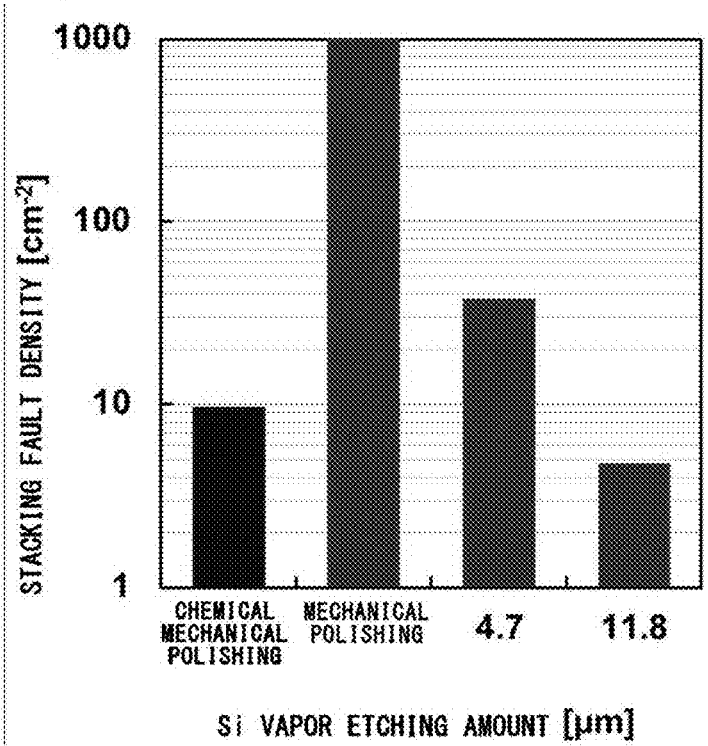
FIG. 5 A graph showing a relationship between the amount of Si vapor pressure etching and a stacking fault density.
Figure 6:
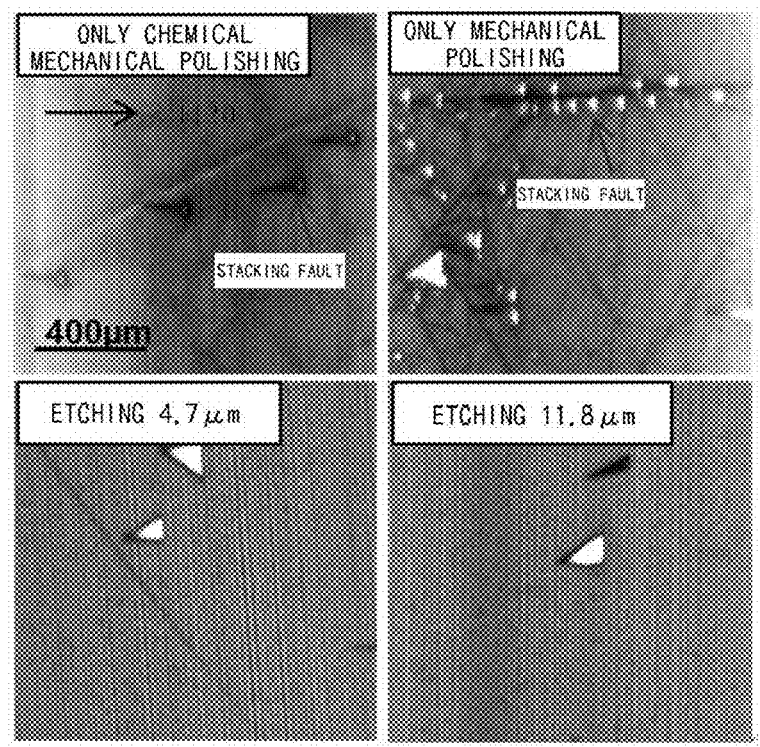
FIG. 6 A photomicrograph of the surface of the SiC substrate in which only mechanical polishing is performed and the surface of the SiC substrate in which only chemical mechanical polishing is performed.

Similarly, four commercially available SiC substrates 40 were prepared. One of four SiC substrates 40 is subjected to only chemical mechanical polishing without etching. One of four SiC substrates 40 is subjected to only mechanical polishing without etching. Two of four SiC substrates 40 is subjected to the etching with a depth of 4.7 μm, and a depth of 11.8 μm, respectively. Then, an epitaxial growth with a depth of 10 μm was performed to four SiC substrates 40. After that, a stacking fault within the epitaxial layer was observed in an area of 400 mm² at the center of the 4-inch wafer, by using photoluminescence (PL) imaging (with an excitation wavelength of 313 nm, an observation wavelength of 400 nm-678 nm). FIG. 5 shows a stacking fault density after the epitaxial growth which was observed by PL imaging. In the SiC substrate 40 subjected to mechanical polishing, in which a plurality of latent scratches remained, the stacking fault density of about 1000/cm² was observed. In the SiC substrate 40 having the depth of etching of 4.7 μm, although the stacking fault density of about 38/cm² was observed, the stacking fault density was decreased to about 4.8/cm² in the SiC substrate 40 having the depth of etching of 11.8 μm. In this case, the SiC substrate 40 in which only chemical mechanical polishing was performed had the stacking fault density of about 9.6/cm². Therefore, the stacking fault density equal to or higher than that when performed chemical mechanical polishing was obtained by the etching of about 11 μm. FIG. 6 shows the PL imaging that was obtained in such case. In the SiC substrate 40 in which chemical mechanical polishing was performed, and in the SiC substrate 40 in which only mechanical polishing was performed without etching, the latent scratches were observed on the epitaxial layer and the bulk substrate interface, and the stacking fault was generated from the latent scratches as a starting point. On the other hand, in the SiC substrate 40 in which the etching was performed after mechanical polishing, it can be seen that the plurality of latent scratches was removed in the SiC substrate 40 in which only mechanical polishing was performed and the stacking fault was suppressed. As such, the latent scratches that were caused by mechanical polishing was removed by etching and thereby the stacking fault that was caused by the latent scratches was reduced, which can obtain a high-quality epitaxial layer.

Next, the etching performed in this embodiment will be described. In this embodiment, the SiC substrate 40 stored in the crucible 30 is heated under high-purity Si vapor pressure up to a temperature of 1500° C. or more and 2200° C. or less and desirably 1600° C. or more and 2000° C. or less by using the high temperature vacuum furnace 10. The SiC substrate 40 is heated under this condition, and thereby the surface can be etched. In such etching, the following reactions are performed. Briefly, the SiC substrate 40 is heated under Si vapor pressure, and thereby Si atoms are eliminated from SiC by thermal decomposition. Si vapor is supplied from the tantalum silicide layer. C that is remained by Si atoms eliminated by thermal decomposition reacts with Si vapor, and thereby sublimates into $Si_2C$ or $SiC_2$.

$$SiC(s) \rightarrow Si(v)I + C(s) \quad (1)$$

$$Ta_xSi_y \rightarrow Si(v)II + Ta_xSi_{y'} \quad (2)$$

$$2C(s) + Si(v)I + II \rightarrow SiC_2(v) \quad (3)$$

$$C(s) + 2Si(v)I + II \rightarrow Si_2C(v) \quad (4)$$

In the above-described reactions, the SiC substrate 40 reacts with Si vapor and then etched by using $SiC_2$ or $Si_2C$ as a reaction product.

Figure 7:
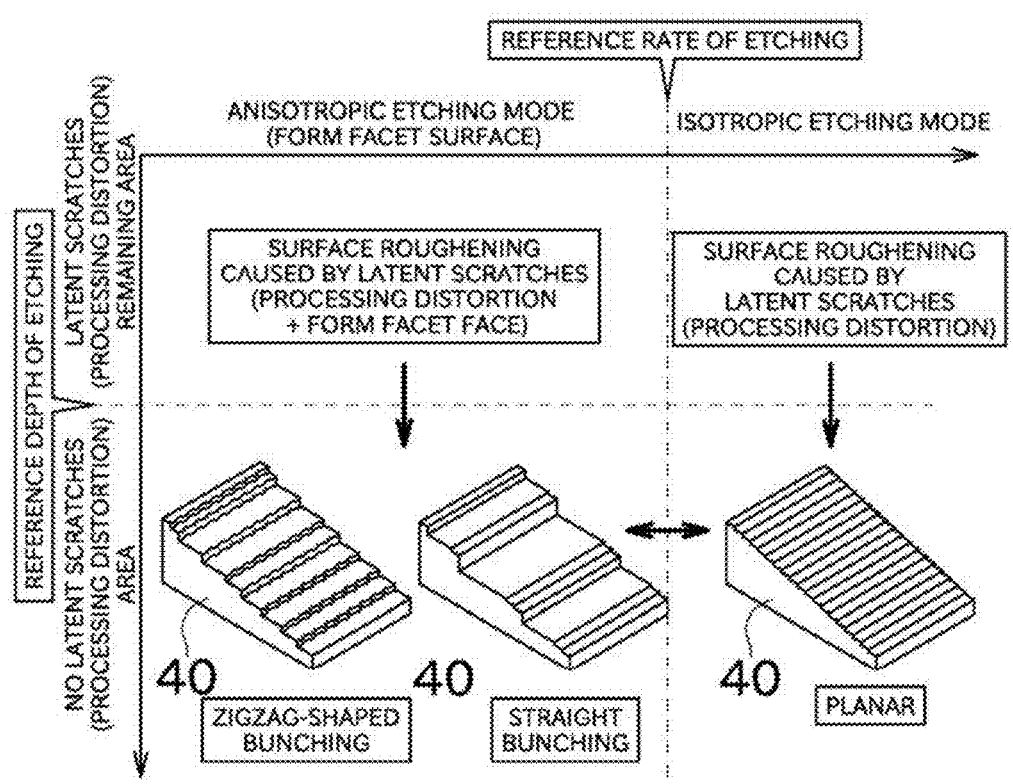
FIG. 7 A drawing schematically showing a situation that a surface pattern of the SiC substrate is determined depending on a depth of etching and a rate of etching.

FIG. 7 is a drawing schematically showing a situation of a surface pattern of the SiC substrate 40 when the horizontal axis represents the rate of etching. The etching treatment is performed to the SiC substrate 40 having the off angle, and thereby a step/terrace structure is formed. A step/terrace structure is a structure having a plurality of steps. A planar area is referred to as a terrace, and a step area where the height is changed is referred to as a step.

As shown in FIG. 7, when the rate of etching is less than the reference rate of etching (details will be described later), the etching mode is the anisotropic etching mode, which is less likely to decompose the step/terrace structure and likely to form a facet face. Therefore, an area where a terrace width and a step height are large (step bunching) is generated. On the other hand, when the rate of etching is higher than the reference rate of etching, the etching mode is the isotropic etching mode, which is likely to decompose the step/terrace structure and therefore the step bunching is not generated. Thus, a planar plane having a plurality of steps with a small terrace width and a low step height is formed.

Figure 8:
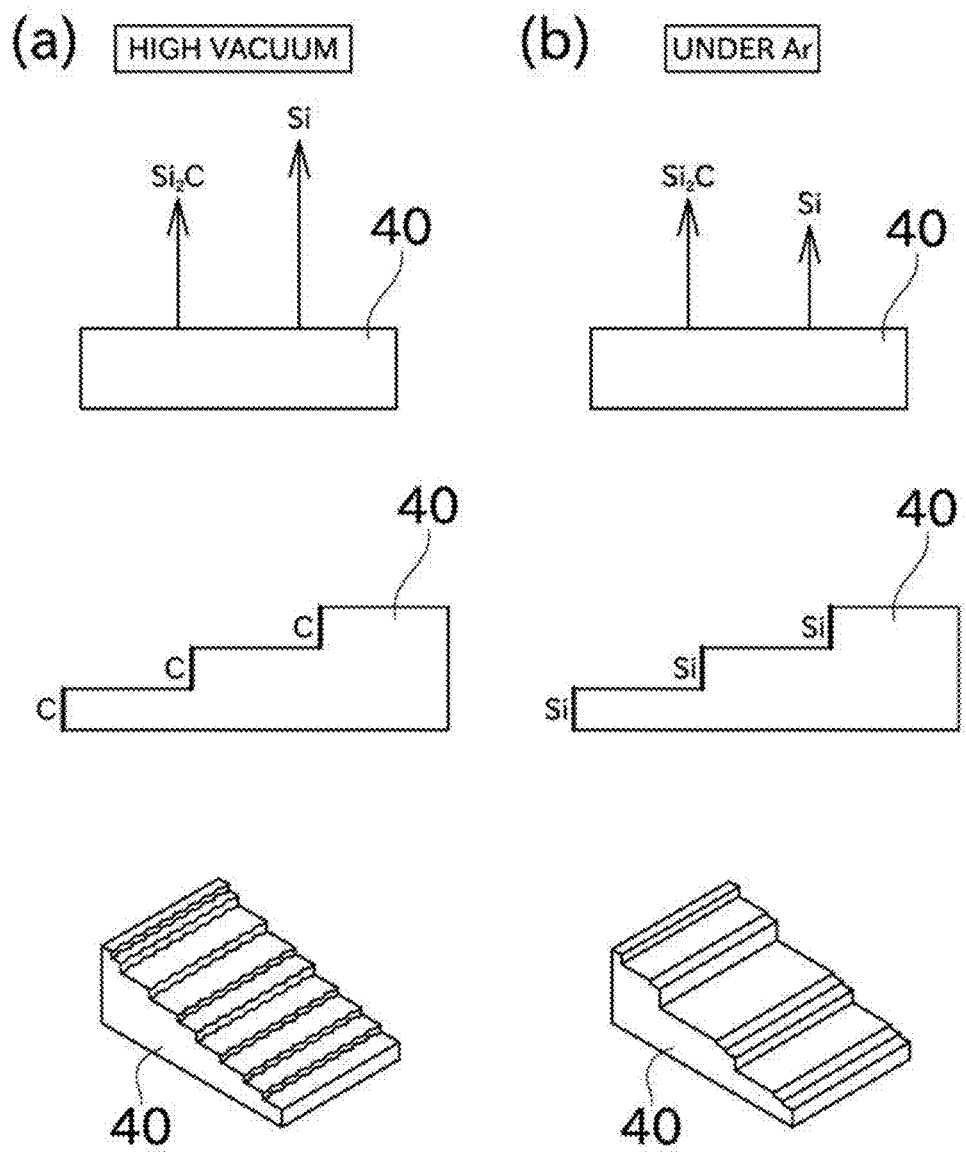
FIG. 8 A drawing showing a situation that a zigzag-shaped bunching is generated and a situation that a straight bunching is generated.

Here, when the etching is performed in the anisotropic etching mode, as shown in FIG. 7, a zigzag-shaped bunching or a straight bunching are generated. Such phenomenon is considered by a reaction model of Si or C atoms at a step end that is resulted from the off angle on the surface of the SiC substrate 40. FIG. 8 shows a conceptual diagram of a bunching forming model when the pressure condition is set under high vacuum or inert gas pressure such as Ar gas with a constant heating temperature. As shown in FIG. 8 (a), under high vacuum, Si atoms is predominantly eliminated by thermal decomposition of the SiC substrate 40. The rate of elimination of $Si_2C$ or the like that reacts with an external Si vapor is lower than the rate in which Si atoms are eliminated by thermal decomposition of the SiC substrate 40. As a result, C is likely to remain in a terrace end and a zigzag-shaped bunching is likely to be generated (C elimination rate-controlling reaction). On the other hand, as shown in FIG. 8 (b), under inert gas pressure, an effect of a partial pressure of the inert gas results in suppression of the reaction in which Si atoms is eliminated by thermal decomposition of the SiC substrate 40. The rate of elimination of $Si_2C$ or the like that reacts with the external Si vapor is higher than the rate in which Si atoms is eliminated by thermal decomposition of the SiC substrate 40. As a result, Si is likely to remain, and the straight bunching is likely to be generated (Si elimination rate-controlling reaction).

As such, an atmosphere for etching is changed, which can control (select) whether to generate the zigzag-shaped bunching or the straight bunching. Since the reference rate of etching is determined based on the rate of C elimination and the rate of Si elimination during the etching, the presence or absence of generation of the step bunching can be controlled by changing the atmosphere for etching.

Next, a change of a temperature (hereinafter, heating temperature) during the etching under a constant pressure condition and a change of a reference rate of etching when the off angle of the SiC substrate 40 is varied will be described with reference to FIG. 9. The SiC substrate 40 having the off angle that is oriented in [11-20] direction is used.

Figure 9:
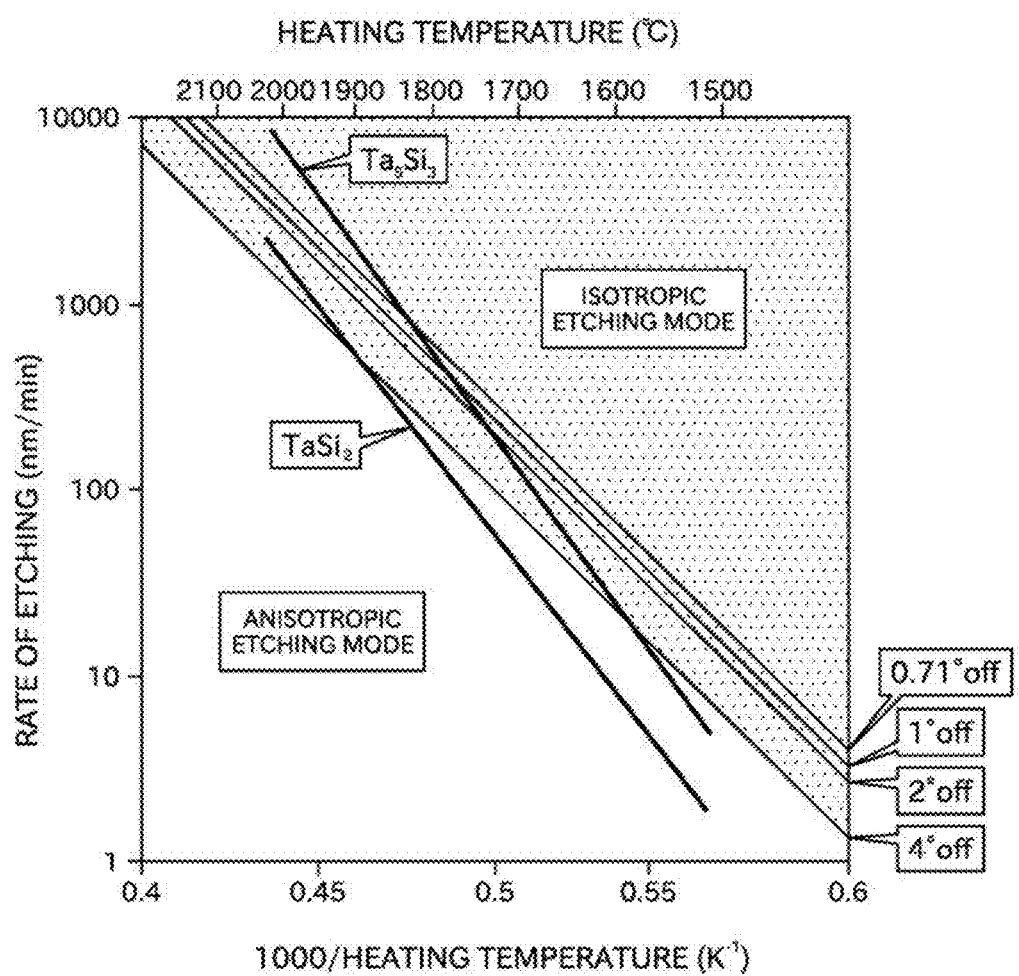
FIG. 9 A graph showing how a boundary line between an isotropic etching mode and an anisotropic etching mode is changed depending on a heating temperature and an off angle.

The vertical axis of the graph of FIG. 9 represents the rate of etching, and the horizontal axis represents the heating temperature. The graph shows a relationship between the heating temperature and the rate of etching for $TaSi_2$ and $Ta_5Si_3$. As such, a composition of the tantalum silicide layer of the crucible 30 is changed, and thereby the rate of etching can be changed without changing the heating temperature. Therefore, the surface pattern of the SiC substrate 40 can be measured with various conditions.

In FIG. 9, straight lines that mean a boundary between the isotropic etching mode and the anisotropic etching mode are shown in each of the off angles (specifically, 0.71°, 1°, 2°, 4°) of the SiC substrate 40. A right-side area upper than each of the straight lines represents the isotropic etching mode. A left-side area lower than each of the straight lines represents the anisotropic etching mode. That is, these straight lines show a change of the reference rate of etching in each of the heating temperatures. As shown in FIG. 9, it can be seen that the reference rate of etching is large as the heating temperature is higher and the reference rate of etching is large as the off angle is smaller.

Figure 10:
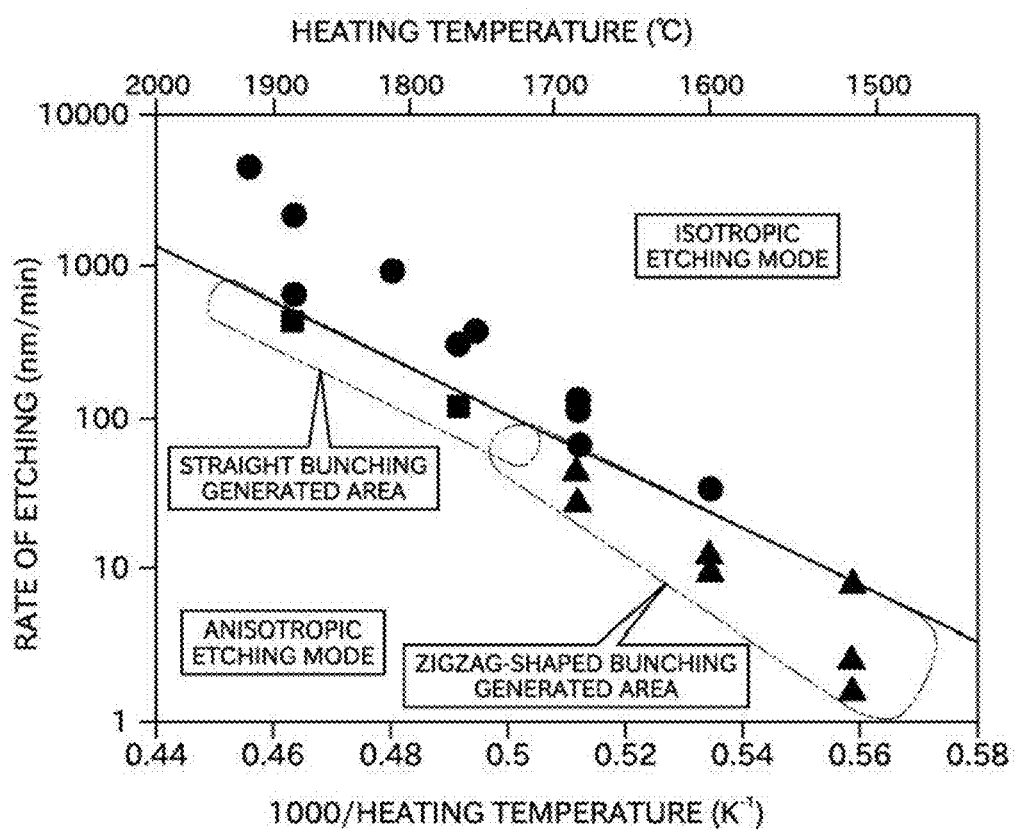
FIG. 10 A graph showing a region where the straight bunching is generated and a region where the zigzag-shaped bunching is generated.

FIG. 10 shows that either the zigzag-shaped bunching or the straight bunching is generated when the etching is performed in the anisotropic etching mode while changing the heating temperature under a constant pressure condition. As shown in FIG. 10, when the etching is performed in the anisotropic etching mode, the straight bunching is generated in a high heating temperature. The zigzag-shaped bunching is generated in a low heating temperature. This may be because Si atoms are more likely to be eliminated from the SiC substrate 40 as the heating temperature is higher. Although FIG. 10 does not show, either a situation that the zigzag-shaped bunching is generated or a situation that the straight bunching is generated is varied depending on the off angle of the SiC substrate 40.

As such, the off angle and the heating temperature of the SiC substrate 40 for the etching is changed, which can control whether to generate the step bunching and the step bunching that is generated.

Figure 11:
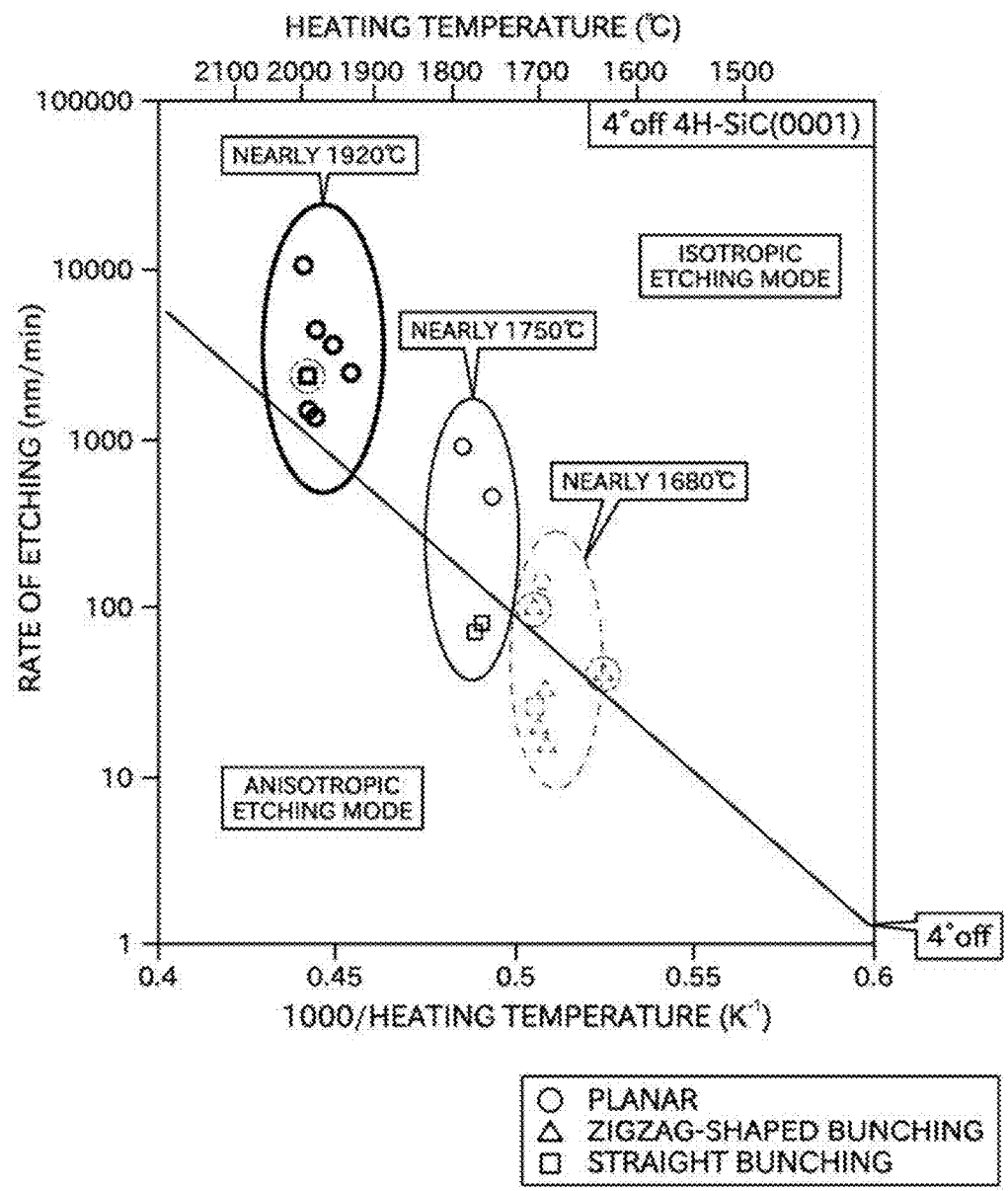
FIG. 11 A graph showing a result in which the etching is performed in three types of temperature zones, in correspondence with the heating temperature and the rate of etching.
Figure 12:
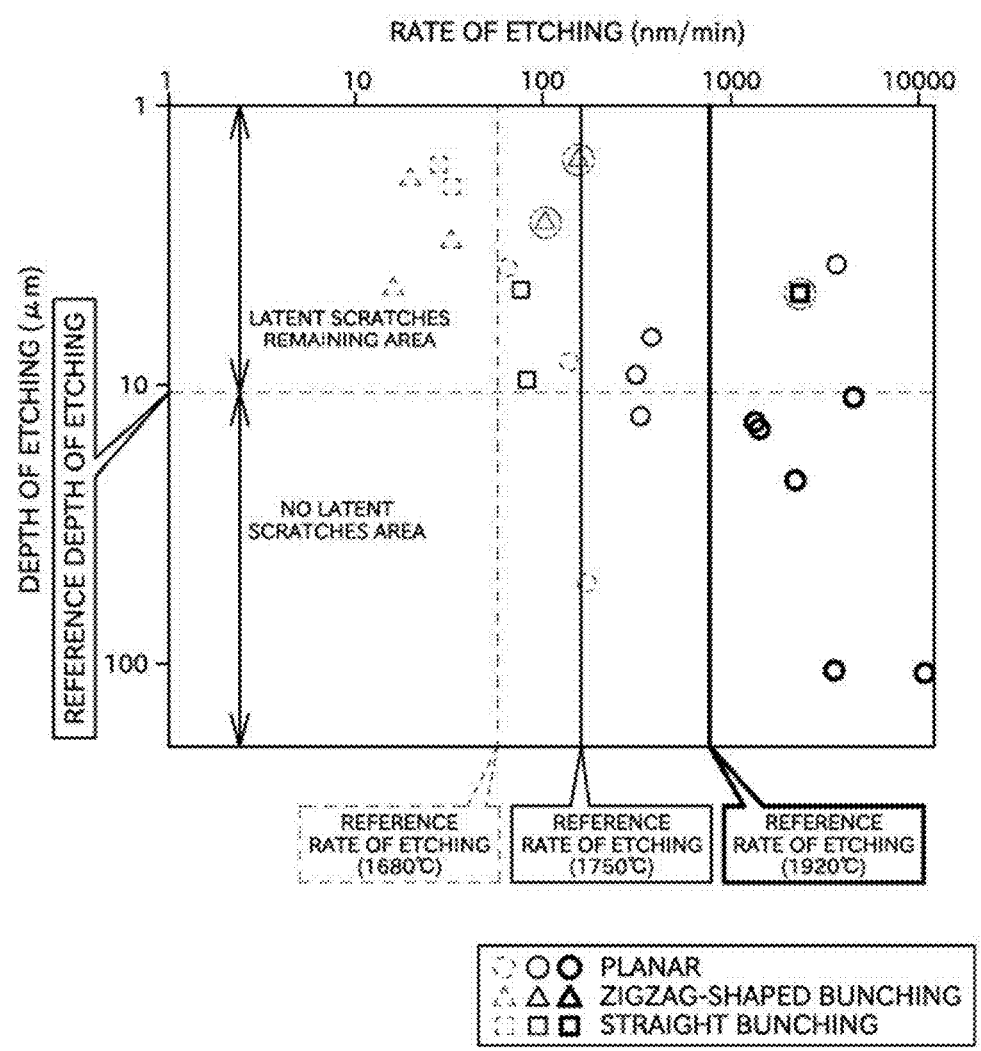
FIG. 12 A graph showing a result in which the etching is performed in three types of temperature zones, in correspondence with a depth of etching and the rate of etching.

FIG. 11 and FIG. 12 show the results in which the etching is performed to (0001) Si-face of the 4H-SiC substrate 40 having the off angle of 4°, in a temperature of nearly 1680 □, nearly 1750 □, and nearly 1920□. A graph of FIG. 11 shows a surface pattern of the SiC substrate 40 when the etching is performed at a predetermined rate of etching and at a predetermined heating temperature. In FIG. 11, a result at nearly 1920□ is represented by a bold line, a result at nearly 1750□ is represented by a normal line, and a result at nearly 1680° C. is represented by a dashed line. A graph of FIG. 12 is obtained by plotting the experiment result performed in FIG. 11 based on the depth of etching and the rate of etching. In the following description, a boundary between an area where the latent scratches are existing and an area where the latent scratches are not existing is referred to as "a reference depth of etching". The area where the latent scratches are existing depends on the treatment (mechanical polishing and chemical mechanical polishing, etc.) performed for the SiC substrate 40 (that is, it depends on a manufacturer of the SiC substrate 40).

In FIG. 11, similarly to FIG. 9 and the like, a right-side area upper than a straight line having a mark of 4° OFF represents the isotropic etching mode. The left-side area lower than the straight line represents the anisotropic etching mode. In FIG. 12, the reference rate of etching at a heating temperature of 1680□ is shown by a dashed straight line that extends vertically. The surface pattern at the heating temperature of 1680□ is shown by dashed symbols. When the dashed symbols are located on the right-side of the dashed line, it means the result in which the etching is performed in the isotropic etching mode. When the dashed symbols are located on the left side of the dashed line, it means the result in which the etching is performed in the anisotropic etching mode. The same applies to the cases at other heating temperatures.

Therefore, as shown in FIG. 11 and FIG. 12, in the SiC substrates 40 in which the etching was performed in the isotropic etching mode, a planar surface pattern could be obtained in most SiC substrates 40. As shown by dashed circles in FIG. 11 and FIG. 12, although the bunching is generated in some SiC substrates 40, it is assumed that they may be the step bunching caused by the latent scratches since the depth of etching is shallower than the reference depth of etching, as shown in FIG. 12.

Next, in a case that the etching is performed with argon (inert gas) that is introduced into a heated atmosphere will be described with reference to FIG. 13 to FIG. 15.

Figure 13:
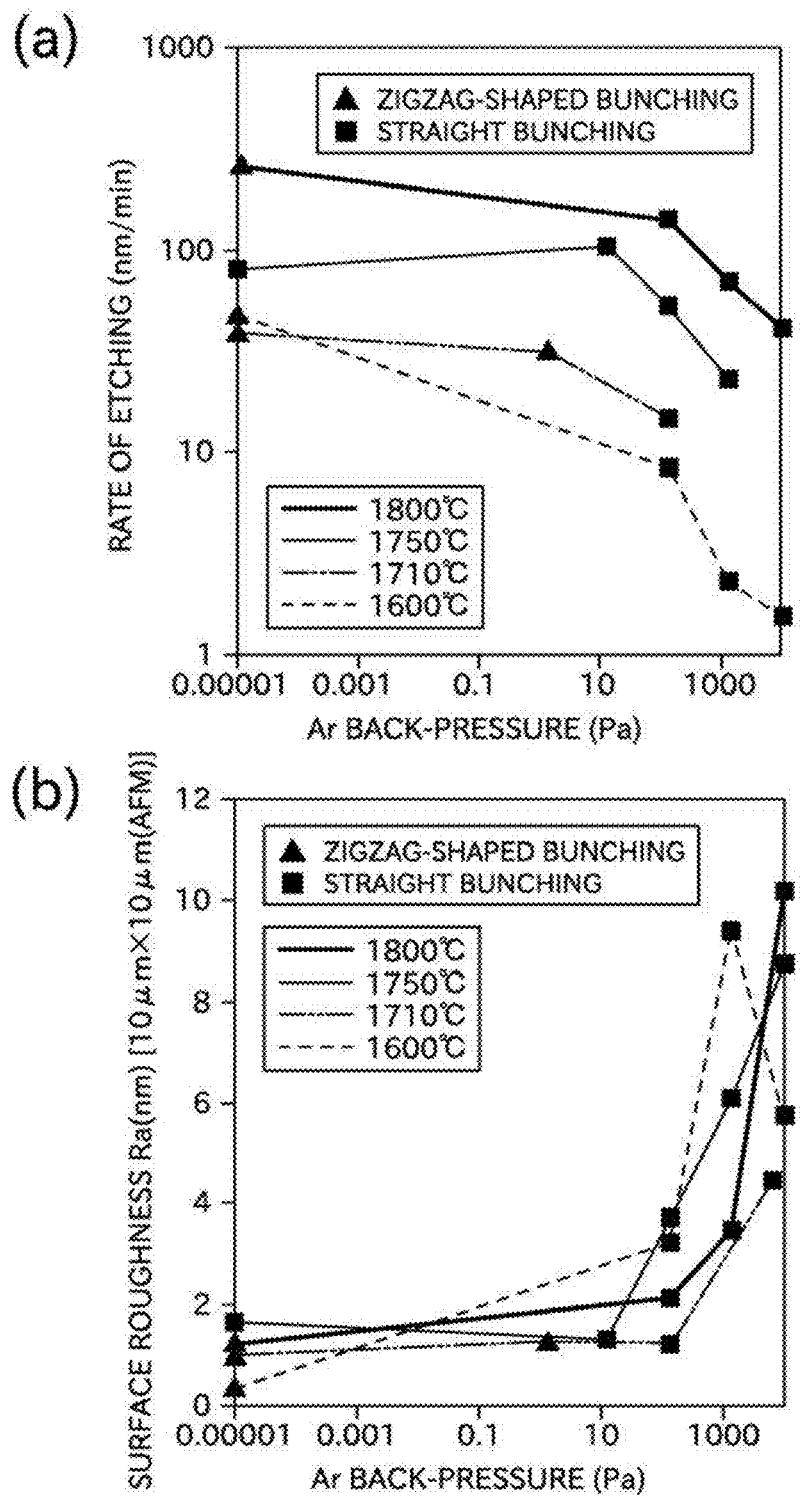
FIG. 13 Graphs showing a type of step bunching that is appeared when the pressure of argon is changed.

In FIG. 13(a), a relationship between a back-pressure (pressure) of argon and the rate of etching is shown for each predetermined temperature. The graph shows that the rate of etching is reduced by increasing the back-pressure of argon. The reason is considered that Si atoms are less likely to be eliminated from the SiC substrate 40 as argon increases. In FIG. 13 (b), a relationship between the back-pressure of argon and a surface roughness after etching is shown for each predetermined temperature. In general, the surface roughness is large since a large step is likely to be formed in the straight bunching.

Figure 14:
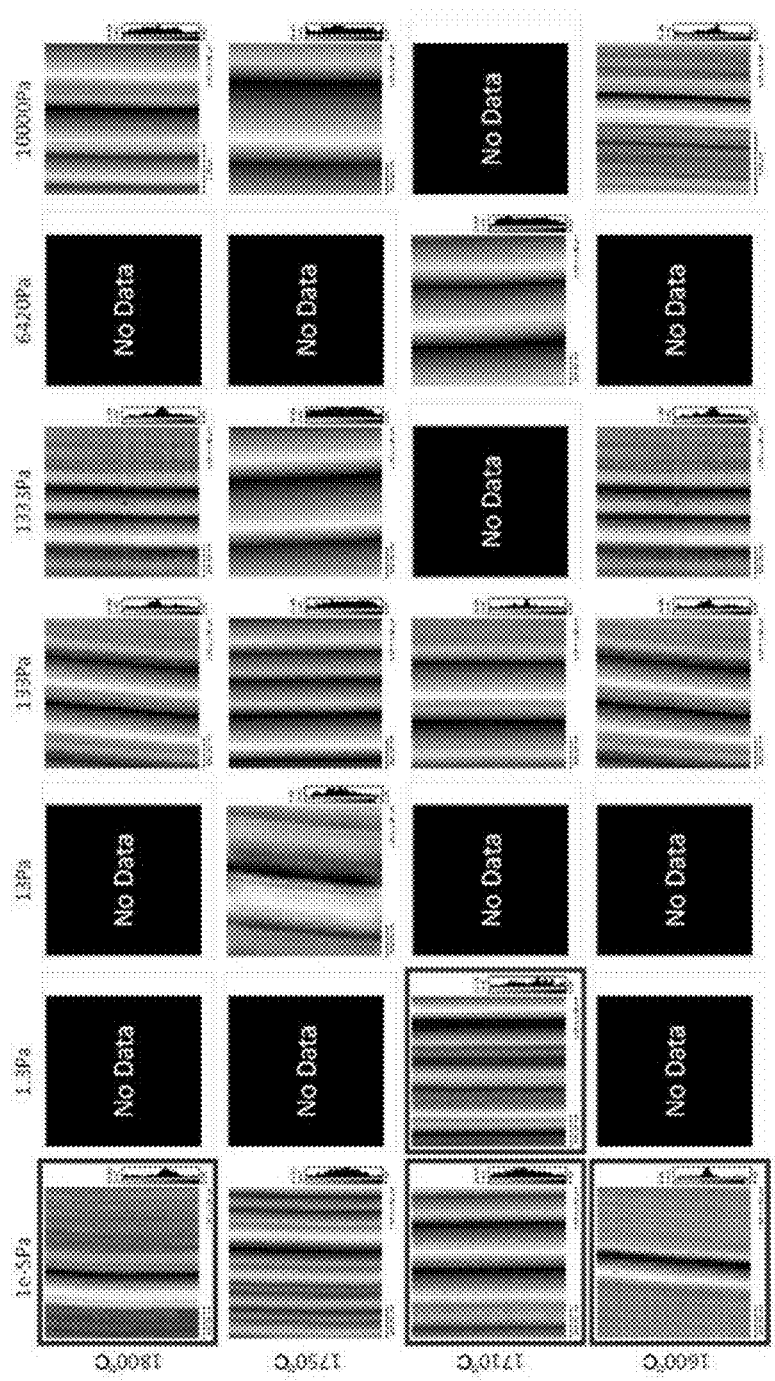
FIG. 14 AFM images showing the step bunching that is appeared when the pressure of argon is changed.

FIG. 14 shows AFM images in which the surface of the SiC substrate 40 (4H-SiC, off angle: 4°, Si-face) obtained in the experiment of FIG. 13 is observed by AFM (atomic force microscope). Four AFM images that are respectively enclosed by squares show situations that a zigzag-shaped bunching is generated. Other AFM images show situations that a straight bunching is generated.

FIG. 15 is a diagram more specifically showing the step bunching that is formed on the surface of the SiC substrate 40 at a heating temperature of 1710□, among four types of heating temperature in the experiment of FIG. 13. FIG. 15 (a) more specifically shows AFM images similarly to that of FIG. 14. FIG. 15 (b) shows SEM images in which the surface of the same SiC substrate 40 is observed by SEM (scanning electron microscope). FIG. 15 (b) clearly shows that the zigzag-shaped bunching is generated when the back-pressure of argon is $10^{-5}$ Pa and 1.3 Pa, and the straight bunching is generated when the back-pressure of argon is 133 Pa and 6420 Pa.

FIG. 13 to FIG. 15 shows that, the zigzag-shaped bunching is mainly generated (that is, the rate of Si elimination is faster) when argon is not introduced or the introduction amount of argon is small, and the straight bunching is likely to be generated (that is, the rate of C elimination is faster) as the introduction amount of argon is larger. The anisotropic etching mode is always kept in the experiment of FIG. 13 since the rate of etching is suppressed by a composition of the tantalum silicide layer. However, by utilizing the rate of etching that is changed in accordance with the introduction amount of argon, it is possible to switch between the etching in the isotropic etching mode or the etching in the anisotropic etching mode, in accordance with the introduction amount of argon.

As described above, whether or not the step bunching is generated, and if generated, whether to generate the zigzag-shaped bunching or the straight bunching, are determined based on the rate of etching, the depth of etching, the heating temperature, the off angle of the SiC substrate 40, and the pressure of inert gas, etc. Therefore, these parameter are changed, which can manufacture the SiC substrate 40 having a desired surface pattern.

The SiC substrate 40 in which the step bunching is not generated does not cause local concentration of electric field or the like, and therefore has high performance as a semiconductor element. However, it is known that the substrate in which the step bunching is generated has more powerfully effect of eliminating the crystal defect (dislocation) during MSE (metastable solvent epitaxy process) or the like. Since the shapes of the zigzag-shaped bunching and the straight bunching are different from each other, their characteristics are different. In addition, the depth of etching is deeper than the reference depth of etching, which can create the SiC substrate 40 having a small surface roughening. As above, the SiC substrate 40 having a desired surface pattern can be manufactured by changing the conditions when the etching is performed.

As described above, in this embodiment, in a surface treatment method in which the surface of the SiC substrate 40 is etched by heating the SiC substrate 40 under Si vapor pressure, a surface pattern of the SiC substrate 40 after the etching treatment is controlled by etching the SiC substrate 40 while controlling the etching mode that is determined based on at least the rate of etching, and the depth of etching.

Accordingly, the rate of etching is changed, which can select whether to generate the step bunching or the type of step bunching, for example. Furthermore, an effect of latent scratches is suppressed, for example, by performing the etching while controlling the depth of etching, which can obtain the SiC substrate 40 having a smooth terrace.

The surface treatment method of this embodiment has the anisotropic etching mode when the rate of etching is smaller than the reference rate of etching, and the isotropic etching mode when the rate of etching is larger than the reference rate of etching. When the etching is performed in the anisotropic etching mode, the step bunching remains. When the etching is performed in the isotropic etching mode, the step bunching is decomposed.

Accordingly, the etching can be performed so as not to generate the step bunching, or so as to generate the step bunching.

In the surface treatment method of this embodiment, the reference rate of etching is determined based on the temperature in etching, the off angle of the SiC substrate 40, and the pressure of inert gas.

Accordingly, the reference rate of etching is determined while controlling the above-described conditions, which can accurately control whether to generate the step bunching and the type of step bunching that is generated.

In the surface treatment method of this embodiment, when the etching is performed in the anisotropic etching mode, the etching is performed while controlling at least any one of the rate of etching, the temperature in etching, the off angle of the SiC substrate 40, and the pressure of inert gas, which can control that a terrace edge after the etching treatment has a straight shape or a zig-zag shape.

Accordingly, either one of two types of step bunching having different characteristics can be selected and generated.

In the surface treatment method of this embodiment, the rate of etching is adjusted based on at least any one of the temperature in etching, the pressure of inert gas, and a composition of a tantalum silicide provided within the crucible 30 that stores the SiC substrate 40.

Accordingly, the rate of etching can be changed in various ways, which can adjust the rate of etching even when, for example, the temperature in etching is not preferably changed.

Although a preferred embodiment of the present invention has been described above, the above-described configuration can be modified, for example, as follows.

In the above-described embodiment, although the etching is performed to the SiC substrate 40 after mechanical polishing and chemical mechanical polishing, etc., the same control may be performed when a surface that is roughened during ion implantation and ion activation is etched. The rate of etching is increasing, which can utilize Si vapor pressure etching instead of mechanical polishing and chemical mechanical polishing, etc.

In the above-described embodiment, although the surface pattern of the SiC substrate 40 is controlled by controlling both of the etching mode and the depth of etching, the surface pattern of the SiC substrate 40 can be controlled based on only the etching mode without controlling the depth of etching.

The above-described temperature conditions, pressure conditions and the like are merely illustrative ones, and can be modified as appropriate. A heating apparatus other than the above-described high temperature vacuum furnace 10 may be used, or a container having shapes or materials different from the crucible 30 may be used.

DESCRIPTION OF THE REFERENCE NUMERALS 10 high temperature vacuum furnace
30 crucible
40 SiC substrate

The invention claimed is:

1. A SiC substrate surface treatment method for etching a surface of a SiC substrate by heating the SiC substrate under Si vapor pressure, the SiC substrate surface treatment method in which a surface pattern of the SiC substrate after an etching treatment is controlled by etching the SiC substrate while controlling an etching mode that is determined based on at least a rate of etching,
   wherein the etching mode includes one of an anisotropic etching mode and an isotropic etching mode, wherein in the anisotropic etching mode the rate of etching is lower than a reference rate of etching and in the isotropic etching mode the rate of etching is higher than the reference rate of etching,
   the etching is performed in the isotropic etching mode,
   a step bunching of the SiC substrate is decomposed while etching the SiC substrate, and
   the surface pattern of a whole of one surface of the SiC substrate is controlled.

2. The SiC substrate surface treatment method according to claim 1, wherein the reference rate of etching is determined based on the temperature in etching.

3. The SiC substrate surface treatment method according to claim 1, wherein the reference rate of etching is determined based on an off angle of the SiC substrate.

4. The SiC substrate surface treatment method according to claim 3, wherein the SiC substrate has an off angle of 0.71° or more and 4° or less.

5. The SiC substrate surface treatment method according to claim 3, wherein the off angle is oriented in a [11-20] direction.

6. The SiC substrate surface treatment method according to claim 1, wherein the etching mode is determined based on the rate of etching that is determined by a pressure of inert gas under an atmosphere for heating the SiC substrate.

7. The SiC substrate surface treatment method according to claim 1, wherein the surface of the SiC substrate is 4H-SiC (0001) Si-face.

8. The SiC substrate surface treatment method according to claim 1, wherein the rate of etching is adjusted based on at least any one of the temperature in etching, the pressure of inert gas, and a composition of tantalum silicide provided within a storing container that stores the SiC substrate.

9. The SiC substrate surface treatment method according to claim 1, wherein a depth of etching is determined based on a treatment that is performed to the SiC substrate before etching.

10. The SiC substrate surface treatment method according to claim 9, wherein the treatment is mechanical polishing or chemical mechanical polishing.

11. The SiC substrate surface treatment method according to claim 1, wherein a depth of etching is deeper than a reference depth, the reference depth being a depth of boundary of the SiC substrate between an area where latent scratches exist and an area where latent scratches do not exist.

12. The SiC substrate surface treatment method according to claim 1, wherein the SiC substrate has latent scratches having disordered crystallinity that are formed by applying pressure on the surface of the SiC substrate during mechanical polishing or chemical mechanical polishing, and
after the latent scratches are removed by the etching, a controlled surface pattern of the SiC substrate appears.

13. A SiC substrate surface treatment method for etching a surface of a SiC substrate by heating the SiC substrate under Si vapor pressure, the SiC substrate surface treatment method in which a surface pattern of the SiC substrate after an etching treatment is controlled by etching the SiC substrate while controlling an etching mode that is determined based on at least a rate of etching,
wherein the etching mode includes one of an anisotropic etching mode and an isotropic etching mode, wherein in the anisotropic etching mode the rate of etching is lower than a reference rate of etching and in the isotropic etching mode the rate of etching is higher than the reference rate of etching,
the etching is performed in the anisotropic etching mode,
a step bunching of the SiC substrate remains while etching the SiC substrate,
the surface pattern of a whole of one surface of the SiC substrate is controlled, and
a terrace edge of the step bunching after the etching treatment has a straight shape or zig-zag shape.

14. The SiC substrate surface treatment method according to claim 13, wherein when the etching is performed in the anisotropic etching mode, the etching is performed while controlling at least any one of the rate of etching, the temperature in etching, and the pressure of inert gas, thereby controlling that a terrace edge after etching treatment has a straight shape or zig-zag shape.

15. The SiC substrate surface treatment method according to claim 13, wherein a depth of etching is deeper than a reference depth, the reference depth being a depth of boundary of the SiC substrate between an area where latent scratches exist and an area where latent scratches do not exist.

16. The SiC substrate surface treatment method according to claim 13, wherein the SiC substrate has latent scratches having disordered crystallinity that are formed by applying pressure on the surface of the SiC substrate during mechanical polishing or chemical mechanical polishing, and
after the latent scratches are removed by the etching, a controlled surface pattern of the SiC substrate appears.

* * * * *